United States Patent
Liu et al.

(10) Patent No.: US 11,209,608 B2
(45) Date of Patent: Dec. 28, 2021

(54) OPTICAL MODULE

(71) Applicant: Hisense Broadband Multimedia Technologies Co., Ltd., Qingdao Shandong (CN)

(72) Inventors: Xuxia Liu, Shandong (CN); Yan Zhong, Shandong (CN)

(73) Assignee: Hisense Broadband Multimedia Technologies Co., Ltd., Qingdao Shandong (CN)

( * ) Notice: Subject to any disclaimer, the term of this patent is extended or adjusted under 35 U.S.C. 154(b) by 361 days.

(21) Appl. No.: 16/354,666

(22) Filed: Mar. 15, 2019

(65) Prior Publication Data

US 2019/0317297 A1   Oct. 17, 2019

Related U.S. Application Data

(63) Continuation of application No. PCT/CN2019/078335, filed on Mar. 15, 2019.

(30) Foreign Application Priority Data

Apr. 11, 2018   (CN) .......................... 201810321976.7

(51) Int. Cl.
  *G02B 7/10*    (2021.01)
  *H05K 1/02*    (2006.01)
  *G02B 7/02*    (2021.01)

(52) U.S. Cl.
  CPC .............. *G02B 7/102* (2013.01); *G02B 7/023* (2013.01); *H05K 1/0274* (2013.01)

(58) Field of Classification Search
  CPC .. G02B 6/4214; G02B 6/4249; G02B 6/4292; G02B 7/023; G02B 7/102; H05K 1/0274
  See application file for complete search history.

(56) References Cited

U.S. PATENT DOCUMENTS 7,399,125 B1    7/2008  Whaley
2005/0078920 A1*  4/2005  Lee ..................... G02B 6/3582
                                                    385/92

(Continued)

FOREIGN PATENT DOCUMENTS

CN    102023347 A    4/2011
CN    103941352 A    7/2014

(Continued)

OTHER PUBLICATIONS

State Intellectual Property Office of the People's Republic of China, Office Action and Search Report Issued in Application No. 201810321976.7, dated Jun. 5, 2019, 16 pages,(Submitted with Machine Translation).

(Continued)

*Primary Examiner* — Joseph P Martinez
*Assistant Examiner* — Vipin Patel
(74) *Attorney, Agent, or Firm* — Hauptman Ham, LLP

(57) ABSTRACT

An optical module includes a circuit board, a lens assembly, a first lens array and a second lens array. The circuit board includes a first driving chip, a first photoelectric chip, a second photoelectric chip and a second driving chip. The lens assembly houses the first photoelectric chip and the second photoelectric chip and includes an upper surface having a first groove and a second groove. The first lens array and the second lens array are on a side surface of the second groove. A bottom surface of the first groove includes a reflecting surface. The first photoelectric chip and the second photoelectric chip are configured such that light coming from or to the first photoelectric chip, or from or to second photoelectric chip, is reflected by the reflecting surface and passes through the first lens array or the second lens array.

11 Claims, 3 Drawing Sheets

(56) References Cited

U.S. PATENT DOCUMENTS

| | | | |
|---|---|---|---|
| 2011/0064358 A1 | 3/2011 | Nishimura | |
| 2014/0153871 A1* | 6/2014 | Kuo | G02B 6/42 385/33 |
| 2014/0153881 A1* | 6/2014 | Liff | G02B 6/43 385/89 |
| 2016/0252690 A1 | 9/2016 | Kawamura | |
| 2017/0269316 A1* | 9/2017 | Chang | G02B 6/425 |

FOREIGN PATENT DOCUMENTS

| | | |
|---|---|---|
| CN | 104280836 A | 1/2015 |
| CN | 105467531 A | 4/2016 |
| CN | 105785524 A | 7/2016 |
| CN | 105929491 A | 9/2016 |
| CN | 106291835 A | 1/2017 |
| CN | 106597616 A | 4/2017 |
| CN | 206609999 U | 11/2017 |
| CN | 107589488 A | 1/2018 |
| CN | 207133475 U | 3/2018 |
| CN | 108508553 A | 9/2018 |

OTHER PUBLICATIONS

ISA State Intellectual Property Office of the People's Republic of China, International Search Report Issued in Application No. PCT/CN2019/078335, dated Jun. 20, 2019, WIPO, 5 pages.

State Intellectual Property Office of the People's Republic of China, Office Action and Search Report Issued in Application No. 2018103219767, dated Feb. 3, 2020, 13 pages, (Submitted with Machine Translation).

\* cited by examiner

OPTICAL MODULE

CROSS-REFERENCE TO RELATED APPLICATIONS

This application is a continuing application of PCT Patent Application No. PCT/CN2019/078335, filed on Mar. 15, 2019, which claims priority to Chinese Patent Application No. 201810321976.7 entitled "OPTICAL MODULE" filed on Apr. 11, 2018, both of which are hereby incorporated in their entireties by reference.

TECHNICAL FIELD

The present disclosure relates to communication technology, and in particular to an optical module.

BACKGROUND

An Active Optical Cable (AOC) is a communication cable for photoelectric conversion by means of external energy during communication. Generally, AOC's include an optical fiber and optical modules located on both ends of the optical fiber. The photoelectric conversion can be realized by connecting the optical fiber and the optical modules.

SUMMARY

An aspect of this description is related to an optical module. The optical module comprises a circuit board. The circuit board comprises a first driving chip, a first photoelectric chip, a second photoelectric chip and a second driving chip in order along a first direction. The optical module also comprises a lens assembly housing the first photoelectric chip and the second photoelectric chip. The lens assembly comprises an upper surface having a first groove and a second groove. The optical module further comprises a first lens array and a second lens array arranged in a top-down direction on a side surface of the second groove. A bottom surface of the first groove comprises a reflecting surface. The first photoelectric chip is configured such that light coming from or to the first photoelectric chip is reflected by the reflecting surface and passes through the first lens array. The second photoelectric chip is configured such that light coming from or to the second photoelectric chip is reflected by the reflecting surface and passes through the second lens array.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION OF THE EMBODIMENTS

Figure 1:
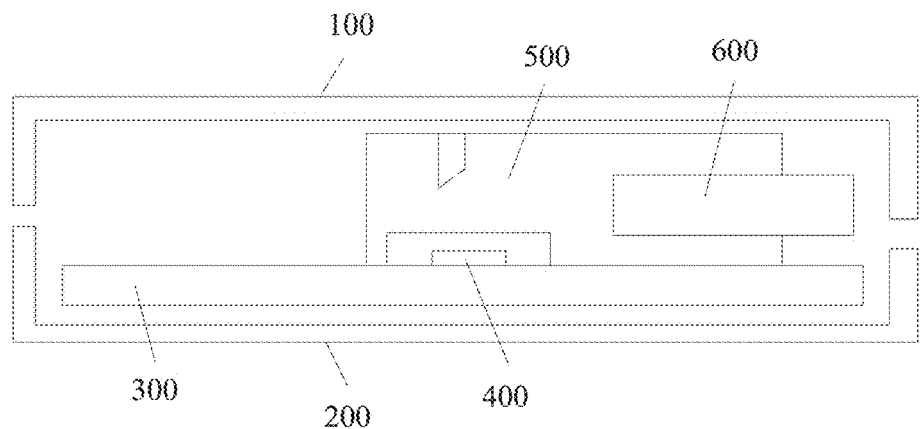
FIG. 1 is a schematic diagram of an optical module, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An optical module is a component for realizing photoelectric conversion in an AOC. That is, a transmitter converts electrical signals into optical signals and transmits the optical signals via optical fibers. A receiver converts optical signals received into electrical signals.

FIG. 1 is a schematic diagram of an optical module, in accordance with one or more embodiments. Generally, the optical module includes an upper housing 100, a lower housing 200, as well as a circuit board 300, one or more chips 400, a lens assembly 500, and an optical fiber bracket 600 which are located in a chamber formed by the upper housing 100 and the lower housing 200.

The one or more chips 400 are over a surface of the circuit board 300. The lens assembly 500 is over the one or more chips 400. The chip 400 transmits/receives light by way of the lens assembly 500. One side of the lens assembly 500 comprises the optical fiber bracket 600. The optical fiber bracket 600 is configured to connect an optical fiber with the lens assembly 500 to establish an optical connection between the lens assembly 500 and the optical fiber.

An optical module with the above structure is suitable for connecting a single row of optical fibers. With the increase of optical fiber transmission rate, the number of optical fibers needed for transmission is continuously increased. To receive more optical fibers and realize photoelectric conversion, it is necessary to leave more space for the lens assembly and the optical fiber bracket, resulting in larger optical modules. However, larger optical modules are not desirable for integrated packaging, and may increase the manufacturing cost of the optical modules.

The present disclosure provides an optical module aimed to decrease the volume of the optical module and reduce the manufacturing cost of the optical module while realizing multi-channel transmission.

In some embodiments, the optical module includes: a first driving chip, a first photoelectric chip, a second photoelectric chip and a second driving chip which are arranged in order on a circuit board along a first direction, and a lens assembly housing the first photoelectric chip and the second photoelectric chip. A first groove and a second groove are provided on an upper surface of the lens assembly. A bottom surface of the first groove forms a reflecting surface, and a side surface of the second groove close to the first groove is provided with a first lens array and a second lens array which are arranged in order from the top of the side surface.

Light emitted from the two photoelectric chips is reflected at different positions of the reflecting surface and then enters the first lens array and the second lens array, respectively. Since the side surface of the second groove is provided with the first lens array and the second lens array, light transmission channels are increased, the volume of the optical module is decreased, and the manufacturing cost of the optical module is reduced. In some embodiments, the first photoelectric chip and the second photoelectric chip are adjacently arranged, the light coming from or to the first photoelectric chip gets reflected by the reflecting surface and passes through the first lens array, and the light coming from or to the second photoelectric chip gets reflected by the reflecting surface and passes through the second lens array. The reflecting surface can, therefore, reflect two beams of light at the same time, resulting in two optical paths along the top-down direction, thereby increasing light transmission channels and realizing simultaneous multi-channel transmission.

Figure 2:
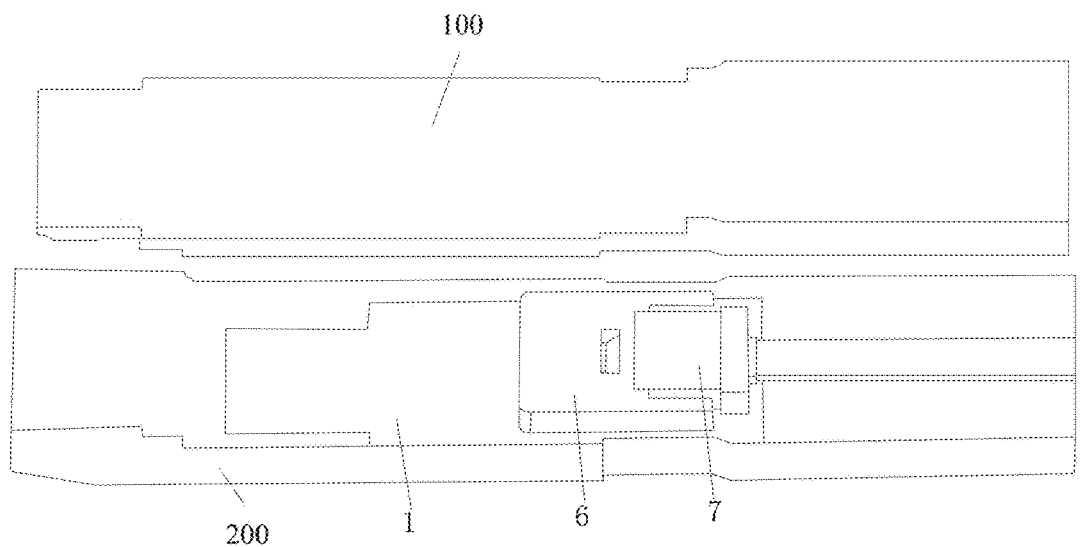
FIG. 2 is a schematic diagram of an optical module, in accordance with one or more embodiments.
Figure 3:
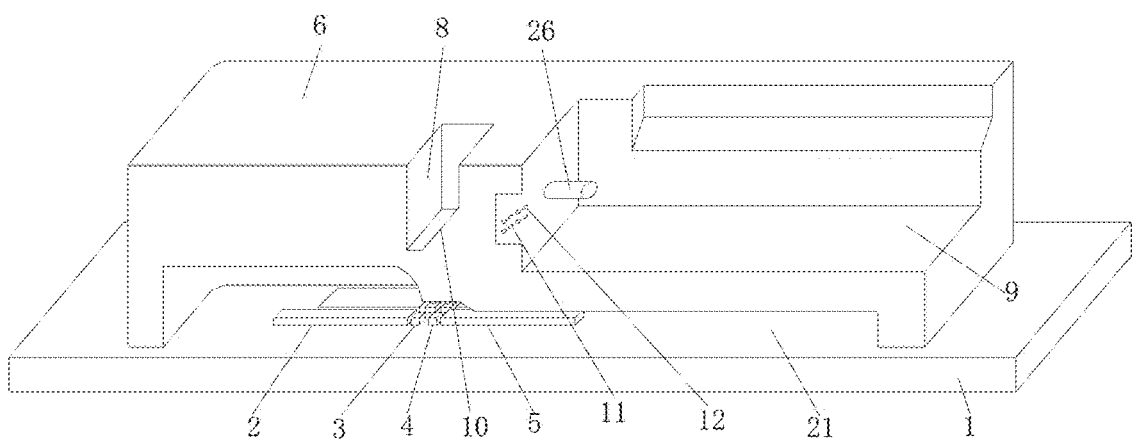
FIG. 3 is a schematic diagram of a cross section of an optical module, in accordance with one or more embodiments.

FIG. 2 and FIG. 3 are discussed below. FIG. 2 is a schematic diagram of an optical module in accordance with one or more embodiments. FIG. 3 is a schematic diagram of a cross section of an optical module in accordance with one or more embodiments.

In some embodiments, as shown in FIG. 2 and in FIG. 3, the optical module includes an upper housing 100 and a lower housing 200. The upper housing 100 and the lower housing 200 are combined to form a hollow chamber. A circuit board 1, a first driving chip 2, a first photoelectric chip 3, a second photoelectric chip 4, a second driving chip 5, a lens assembly 6 and an optical fiber bracket 7 are encapsulated in the chamber formed by the upper housing 100 and the lower housing 200, thereby forming a whole optical module.

The circuit board 1 is placed at the bottom of the lower housing 200. The circuit board 1 is provided with the first driving chip 2, the first photoelectric chip 3, the second photoelectric chip 4 and the second driving chip 5 sequentially along a same direction of the circuit board 1, for example, along a length direction or a width direction of the circuit board 1. In some embodiments, since the circuit board 1 is sequentially provided with the first driving chip 2, the first photoelectric chip 3, the second photoelectric chip 4 and the second driving chip 5, the first driving chip 2 is configured to drive the first photoelectric chip 3 and the second driving chip 5 is configured to drive the second photoelectric chip 4, thereby facilitating driving the photoelectric chips by the corresponding driving chips.

The lens assembly 6 houses the first photoelectric chip 3 and the second photoelectric chip 4, and is configured to reflect the light coming from or to the first photoelectric chip 3 and the second photoelectric chip 4. An upper surface of the lens assembly 6 is provided with a first groove 8 and a second groove 9. To reduce the volume of the lens assembly 6, the first groove 8 and the second groove 9 are adjacently arranged. A bottom surface of the first groove 8 forms a reflecting surface 10. A first lens array 11 and a second lens array 12 are provided on a side surface of the second groove 9, where the side surface is close to the first groove 8. The first lens array 11 and the second lens array 12 are arranged on the side surface of the second groove 9 along a direction from top to bottom, where the direction from top to bottom refers to a height direction of the lens assembly 6.

The reflecting surface 10 formed by the bottom surface of the first groove 8 is configured to reflect the light from or to the first photoelectric chip 3 and the second photoelectric chip 4. Therefore, to facilitate the position arrangement of the first lens array 11 and the second lens array 12, and reduce the volume of the lens assembly 6, an inclined angle of the reflecting surface 10 may be set to 45±5°. By adjusting the inclined angle of the reflecting surface 10, the positions of the first photoelectric chip 3 and the second photoelectric chip 4 together with the positions of the first lens array 11 and the second lens array 12, the reflecting surface 10 is able to reflect the light emitted from the first photoelectric chip 3 and the second photoelectric chip 4 or the light received by the first photoelectric chip 3 and the second photoelectric chip 4.

In some embodiments, the first lens array 11 and the second lens array 12 comprise convex lenses. Thus, the first lens array 11 and the second lens array 12 both have functions of converging light and converting the light into parallel beams. In some embodiments, the first lens array 11 and the second lens array 12 may each include at least eight convex lenses. In some embodiments, the quantity of convex lenses included in the first lens array 11 and the second lens array 12 are the same such that simultaneous transmission of multiple light rays can be realized. Further, to facilitate arranging the first lens array 11 and the second lens array 12 on the side surface of the second groove 9 at the same time and to facilitate incidence of the light reflected by the reflecting surface 10 into the first lens array 11 and the second lens array 12 respectively, the first lens array 11 and the second lens array 12 may be arranged in parallel and are both parallel to the bottom surface of the second groove 9.

In some embodiments, while the first driving chip 2 is driving the first photoelectric chip 3, the light emitted from the first photoelectric chip 3 is reflected into the first lens array 11 by the reflecting surface 10, or, the light passing through the first lens array 11 is reflected into the first photoelectric chip 3 by the reflecting surface 10, thereby realizing the photoelectric conversion during transmission and reception process.

Similarly, while the second driving chip 5 is driving the second photoelectric chip 4, the light emitted by the second photoelectric chip 4 is reflected by the reflecting surface 10 and then guided into the second lens array 12, or, the light passing through the second lens array 12 is reflected by the reflecting surface 10 and then guided into the second photoelectric chip 4, thereby realizing the photoelectric conversion during transmission and reception process.

In some embodiments, by arranging two lens arrays, i.e., the first lens array 11 and the second lens array 12 on the side surface of the second groove 9 along the top-down direction, light transmission channels are increased, the volume of the optical module are decreased, and the manufacturing cost of the optical module is able to be reduced. In addition, since the first photoelectric chip 3 and the second photoelectric chip 4 are adjacently arranged, the light coming from or to the first photoelectric chip 3 passes through the reflecting surface 10 and the first lens array 11, and the light coming from or to the second photoelectric chip 4 passes through the reflecting surface 10 and the second lens array 12. Thus, the reflecting surface 10 is able to reflect two beams of light at the same time and two optical paths are formed along the top-down direction, thereby achieving more than one light transmission channel and light transmission in multiple channels at the same time.

In some embodiments, the first driving chip 2 and the second driving chip 5 are both transmission driving chips 13 or reception driving chips 14. Accordingly, the first photoelectric chip 3 and the second photoelectric chip 4 are both photoelectric transmitting chips 15 or photoelectric receiving chips 16. The transmission driving chips 13 are configured to drive the photoelectric transmitting chips 15, and the reception driving chips 14 are configured to drive the photoelectric receiving chips 16.

Figure 4:
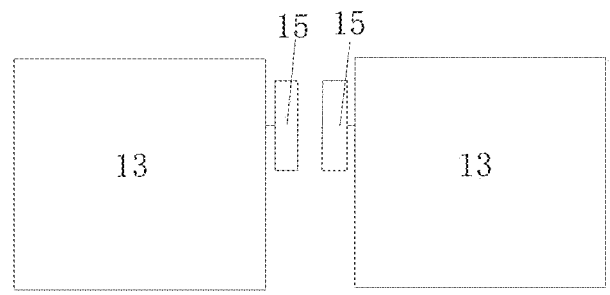
FIG. 4 is a schematic diagram illustrating a first positional relationship of driving chips and photoelectric chips, in accordance with one or more embodiments.

FIG. 4 is a schematic diagram illustrating a first positional relationship of driving chips and photoelectric chips, in accordance with one or more embodiments. As shown in FIG. 4, the first driving chip 2 and the second driving chip 5 are both transmission driving chips 13, and the first photoelectric chip 3 and the second photoelectric chip 4 are both photoelectric transmitting chips 15. While an optical module is in operation, two transmission driving chips 13 control two corresponding photoelectric transmitting chips 15 to radiate light. The light is reflected by the reflecting surface 10 and then irradiated into a corresponding one of the first lens array 11 or the second lens array 12. In this case, the optical module is for light transmission only.

Figure 5:
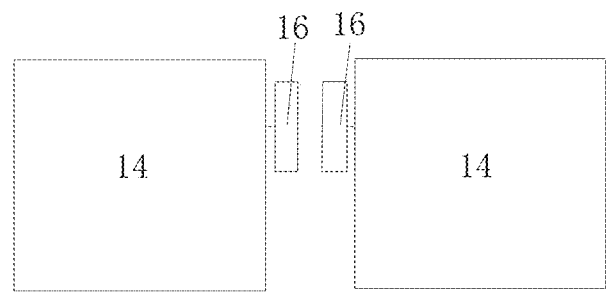
FIG. 5 is a schematic diagram illustrating a second positional relationship of driving chips and photoelectric chips, in accordance with one or more embodiments.

FIG. 5 is a schematic diagram illustrating a second positional relationship of driving chips and photoelectric chips, in accordance with one or more embodiments. As shown in FIG. 5, the first driving chip 2 and the second driving chip 5 are both reception driving chips 14, and the first photoelectric chip 3 and the second photoelectric chip 4 are both photoelectric receiving chips 16. While the optical module is in operation, light passing through the first lens array 11 and the second lens array 12 is reflected by the reflecting surface 10 and then irradiated into two corresponding photoelectric receiving chips 16. The two reception driving chips 14 control two corresponding photoelectric receiving chips 16 to receive the light. In this case, the optical module is for light reception only.

Figure 6:
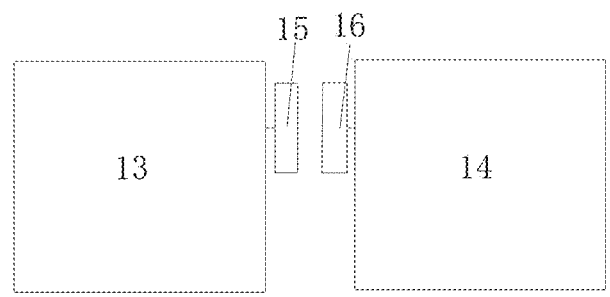
FIG. 6 is a schematic diagram illustrating a third positional relationship of driving chips and photoelectric chips, in accordance with one or more embodiments.

FIG. 6 is a schematic diagram illustrating a third positional relationship of driving chips and photoelectric chips, in accordance with one or more embodiments. As shown in FIG. 6, the first driving chip 2 is a transmission driving chip 13, the first photoelectric chip 3 is a photoelectric transmitting chip 15, the second photoelectric chip 4 is a photoelectric receiving chip 16, and the second driving chip 5 is a reception driving chip 14. While the optical module is operating, the transmission driving chip 13 controls the photoelectric transmitting chip 15 to radiate light. The radiated light is reflected by the reflecting surface 10 and then irradiated into the first lens array 11. Meanwhile, the light passing through the second lens array 12 is reflected by the reflecting surface 10 and then irradiated into the photoelectric receiving chip 16. The reception driving chip 14 controls the photoelectric receiving chip 16 to receive the light. In this case, the optical module is able to realize the transmission and reception of light at the same time.

Figure 7:
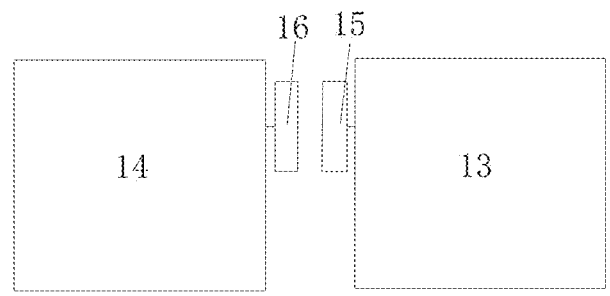
FIG. 7 is a schematic diagram illustrating a fourth positional relationship of driving chips and photoelectric chips, in accordance with one or more embodiments.

FIG. 7 is a schematic diagram illustrating a fourth position relationship of driving chips and photoelectric chips, in accordance with one or more embodiments. As shown in FIG. 7, the first driving chip 2 is a reception driving chip 14, the first photoelectric chip 3 is a photoelectric receiving chip 16, the second photoelectric chip 4 is a photoelectric transmitting chip 15, and the second driving chip 5 is a transmission driving chip 13. While the optical module is operating, the light passing through the first lens array 11 is reflected by the reflecting surface 10 and then irradiated into the photoelectric receiving chip 16. The reception driving chip 14 controls the photoelectric receiving chip 16 to receive the light. Meanwhile, the transmission driving chip 13 controls the photoelectric transmitting chip 15 to radiate light. The radiated light is reflected by the reflecting surface 10 and then irradiated into the second lens array 12. In this case, the optical module is able to realize the transmission and reception of light at the same time.

Figure 8:
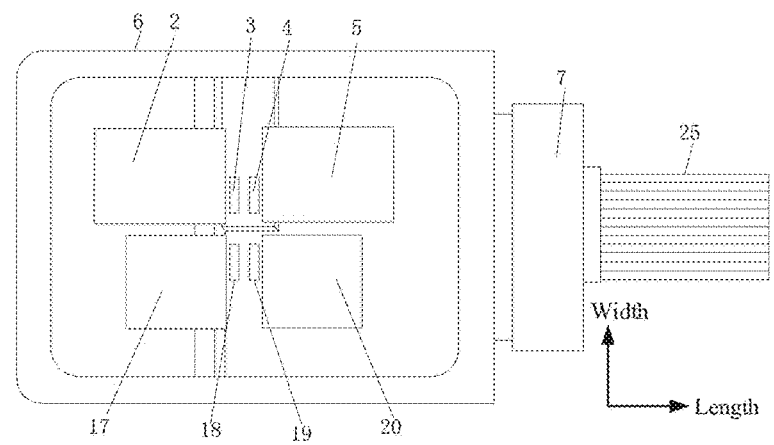
FIG. 8 is a bottom view of the lens assembly in FIG. 3, in accordance with one or more embodiments.

FIG. 8 is a bottom view of a lens assembly in FIG. 3, in accordance with one or more embodiments. In some embodiments, the circuit board 1 is also sequentially provided with a third driving chip 17, a third photoelectric chip 18, a fourth photoelectric chip 19 and a fourth driving chip 20 along a length direction of the circuit board 1. The lens assembly 6 also covers above the third photoelectric chip 18 and the fourth photoelectric chip 19, as shown in FIG. 8. In some embodiments, the third driving chip 17 is configured to drive the third photoelectric chip 18, and the fourth driving chip 20 is configured to drive the fourth photoelectric chip 19.

Similar to the operation process of the first driving chip 2, the first photoelectric chip 3, the second photoelectric chip 4 and the second driving chip 5, while the third driving chip 17 is driving the third photoelectric chip 18, light radiated by the third photoelectric chip 18 is reflected by the reflecting surface 10 and then irradiated into the first lens array 11; or light passing through the first lens array 11 is reflected by the reflecting surface 10 and then irradiated into the third photoelectric chip 18. While the fourth driving chip 20 is driving the fourth photoelectric chip 19 to operate, light emitted by the fourth photoelectric chip 19 is reflected by the reflecting surface 10 and then irradiated into the second lens array 12; or light passing through the second lens array 12 is reflected by the reflecting surface 10 and then irradiated into the fourth photoelectric chip 19.

In some embodiments, the arrangement of the third driving chip 17, the third photoelectric chip 18, the fourth photoelectric chip 19 and the fourth driving chip 20 is able to further increase light transmission channels, thereby realizing simultaneous multi-channel transmission of light.

In some embodiments, the third driving chip 17 and the fourth driving chip 20 may both be the transmission driving chips 13 or the reception driving chips 14. Correspondingly, the third photoelectric chip 18 and the fourth photoelectric chip 19 may both be the photoelectric transmitting chips 15 or the photoelectric receiving chips 16.

When the first driving chip 2 and the second driving chip 5 are the transmission driving chip 13 or the reception driving chip 14, respectively, and the first photoelectric chip 3 and the second photoelectric chip 4 correspondingly are photoelectric transmitting chip 15 or photoelectric receiving chip 16, respectively, there are four position relationships for the driving chips and the photoelectric chips in an optical module and different combinations of light transmission and reception may be achieved.

When the optical module further includes the third driving chip 17, the third photoelectric chip 18, the fourth photoelectric chip 19 and the fourth driving chip 20, there are more combinations of the position relationships of the driving chips and the photoelectric chips in the optical module, resulting in different combinations of light transmission and reception. For example, when the first driving chip 2, the second driving chip 5 and the third driving chip 17 are transmission driving chips 13, the first photoelectric chip 3, the second photoelectric chip 4 and the third photoelectric chip 18 are photoelectric transmitting chips 15, the fourth driving chip 20 is a reception driving chip 14 and the fourth photoelectric chip 19 is an photoelectric receiving chip 16, the optical module is able to realize transmission of three light paths and reception of one light path. Other combinations of the first driving chip 2, the first photoelectric chip 3, the second photoelectric chip 4, the second driving chip 5, the third driving chip 17, the third photoelectric chip 18, the fourth photoelectric chip 19 and the fourth driving chip 20 are possible, but will not be described herein for brevity.

Figure 9:
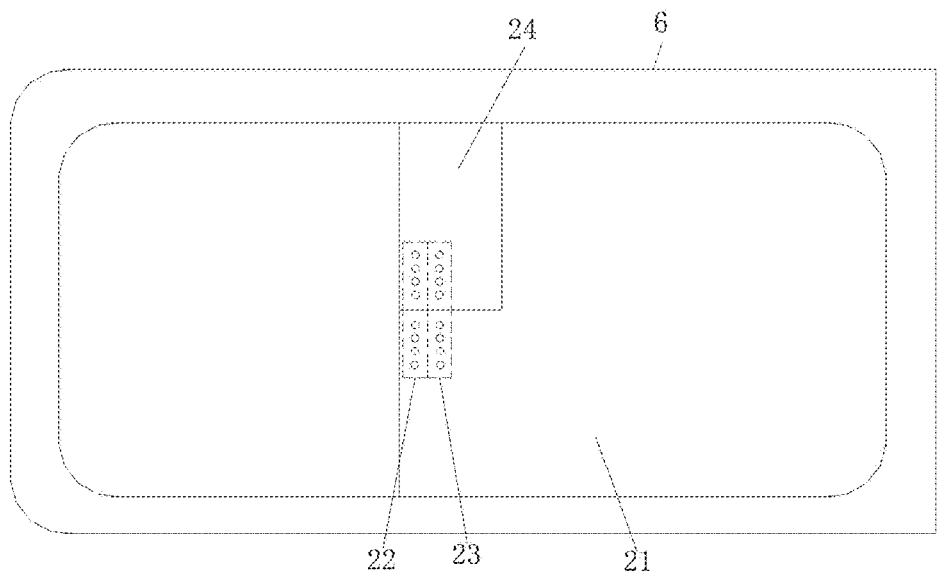
FIG. 9 is a schematic diagram of a third lens array and a fourth lens array, in accordance with one or more embodiments.
Figure 10:
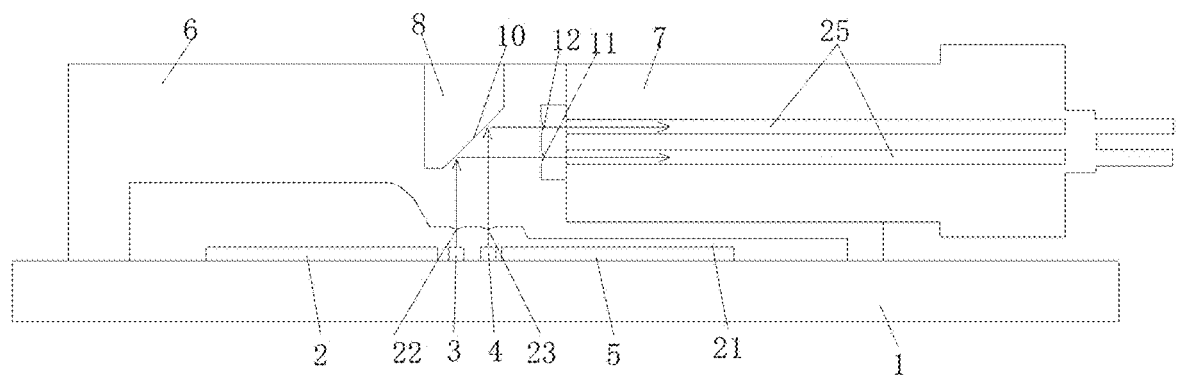
FIG. 10 is a schematic diagram illustrating an optical path of an optical module, in accordance with one or more embodiments.

FIGS. 9 and 10 are discussed below. FIG. 9 is a schematic diagram of a third lens array and a fourth lens array, in accordance with one or more embodiments. FIG. 10 is a schematic diagram illustrating an optical path of an optical module, in accordance with one or more embodiments.

In some embodiments, as shown in FIG. 9 and FIG. 10, a lower surface of the lens assembly 6 is provided with a third groove 21, and a bottom surface of the third groove 21 is provided with a third lens array 22 and a fourth lens array 23. Since the lens assembly 6 is above the first photoelectric chip 3 and the second photoelectric chip 4, the third lens array 22 and the fourth lens array 23 may be placed above the first photoelectric chip 3 and the second photoelectric chip 4. In some embodiments, the third lens array 22 is placed above the first photoelectric chip 3, and the fourth lens array 23 is placed above the second photoelectric chip 4.

The light from the first photoelectric chip 3 becomes parallel light after passing through the third lens array 22, and the parallel light is reflected by the reflecting surface 10 into the first lens array 11; or the light passing through the first lens array 11 is reflected by the reflecting surface 10 into the third lens array 22 and further into the first photoelectric chip 3, thereby realizing the photoelectric conversion in the transmitting process and the receiving process.

The light from the second photoelectric chip 4 becomes parallel light after passing through the fourth lens array 23, and the parallel light is reflected by the reflecting surface 10 into the second lens array 12; or the light passing through the second lens array 12 is reflected by the reflecting surface 10 into the fourth lens array 23 and further into the second photoelectric chip 4, thereby realizing the photoelectric conversion in the transmitting process and the receiving process.

In some embodiments, the lower surface of the lens assembly 6 is also provided with a fourth groove 24, and the depth of the fourth groove 24 is different from that of the third groove 21. In this manner, there is a depth difference between the third groove 21 and the fourth groove 24, resulting in a depth step. In some embodiments, as shown in FIG. 9, the fourth groove 24 is only arranged on a portion of the lower surface of the lens assembly 6 along its width direction, and a portion of convex lenses in the third lens array 22 and the fourth lens array 23 are positioned on the bottom surface of the fourth groove 24. The depth step formed by the third groove 21 and the fourth groove 24 in the depth direction is advantageous in reducing manufacturing materials of the lens assembly 6 and cutting the manufacturing cost of the lens assembly 6. In some embodiments, in order to facilitate arranging photoelectric chips in the grooves, the third photoelectric chip 18 and the fourth photoelectric chip 19 are provided in the third groove 21, and the first photoelectric chip 3 and the second photoelectric chip 4 is provided in the fourth groove 24. In some embodiments, the third photoelectric chip 18 and the fourth photoelectric chip 19 in the third groove 21 are both photoelectric transmitting chips 15, and the first photoelectric chip 3 and the second photoelectric chip 4 in the fourth groove 24 are both photoelectric receiving chips 16.

In some embodiments, the first lens array 11 and the second lens array 12 both include at least eight convex lenses, respectively. Therefore, to enable the light passing through the third lens array 22 and the fourth lens array 23 to irradiate into different convex lenses of the first lens array 11 and the second lens array 12, respectively, the third lens array 22 and the fourth lens array 23 are made to include the same quantity of convex lenses as a corresponding one of the first lens array 11 or the second lens array 12. The light passing through the convex lenses of the third lens array 22 and the fourth lens array 23 is reflected by the reflecting surface 10 into different convex lenses of the first lens array 11 and the second lens array 12, respectively.

In some embodiments, the second groove 9 is also provided with an optical fiber bracket 7 for supporting optical fibers. Two optical fiber arrays 25 in the form of a row are provided in the optical fiber bracket 7. Each optical fiber array 25 includes a plurality of optical fibers, and the number of optical fibers in each optical fiber array in a row may be at least the number of convex lenses in the first lens array 11 or the second lens array 12.

As shown in FIG. 10, the first lens array 11 and the second lens array 12 correspond to one optical fiber array in a row 25, respectively. The first lens array 11 corresponds to the optical fiber array in a lower row, and the second lens array 12 corresponds to the optical fiber array in an upper row. In order to make it easy to irradiate light entering the first lens array 11 and the second lens array 12 into corresponding optical fiber arrays 25, the first lens array 11 is located in the same plane as one optical fiber array, and the second lens array 12 is located in the same plane as the other optical fiber array.

In some embodiments, to make the optical fiber bracket 7 in the second groove 9 steady, two positioning mechanisms 26 are provided on both sides of the first lens array 11 or the second lens array 12, such as positioning columns, and two positioning holes (not shown) are provided on a side surface of the optical fiber bracket 7 which is close to the first lens array 11 or the second lens array 12. The optical fiber bracket 7 is fixed by inserting the positioning columns 26 into the positioning holes of the optical fiber bracket 7. In some embodiments, to make the optical fiber bracket 7 steadily placed in the second groove 9, fixing holes are provided on both sides of the first lens array 11 or the second lens array 12 on the side surface of the second groove 9, and fixing holes are provided on the side surface of optical fiber bracket 7 close to the first lens array 11 or the second lens array 12 as well. Thus, the optical fiber bracket 7 is fixed by inserting both ends of two guiding pins into the fixing holes on the side surface of the second groove 9 and the fixing holes on the side surface of the optical fiber bracket 7.

As shown in FIG. 10, the first driving chip 2 and the second driving chip 5 drive the first photoelectric chip 3 and the second photoelectric chip 4 to emit light. The light emitted by the first photoelectric chip 3 becomes parallel light after passing through the third lens array 22, and the light emitted by the second photoelectric chip 4 becomes parallel light after passing through the fourth lens array 23. Two beams of parallel light go to different positions of the reflecting surface 10, and are then reflected by the reflecting surface 10 to become parallel light in a direction different from that of the above parallel light. The two beams of parallel light along the different direction enter the first lens array 11 and the second lens array 12, respectively, are converged by the first lens array 11 and the second lens array 12, and then irradiated into optical fibers in two rows of optical fibers 25. A process that light received by the first photoelectric chip 3 or the second photoelectric chip 4 passing through the optical fiber array 25, the first lens array 11 or the second lens array 12, the reflecting surface 10 and the third lens array 22 or the fourth lens array 23 is similar to the above process except that the light path is in opposite direction.

The light emitted by the first photoelectric chip 3 and the second photoelectric chip 4 passes through the third lens array 22 and the fourth lens array 23, respectively, gets reflected by the reflecting surface 10, and irradiates into the first lens array 11 and the second lens array 12, respectively. The third lens array 22, the fourth lens array 23, the first lens array 11 and the second lens array 12 include at least eight convex lenses, respectively. Therefore, the simultaneous multi-channel transmission of light is realized in one light transmission process. Further, since the first lens array 11 and the second lens array 12 are arranged on the side surface of the second groove 9 at the same time, and the third lens array 22 and the fourth lens array 23 are arranged at the bottom of the third groove 21 at the same time, the optical module in some embodiments makes it possible to decrease the volume of the optical module while realizing the simultaneous multi-channel transmission and reducing the manufacturing cost of the optical module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An optical module, comprising:
   a circuit board comprising a first driving chip, a first photoelectric chip, a second photoelectric chip and a second driving chip in order along a first direction;
   a lens assembly housing the first photoelectric chip and the second photoelectric chip, the lens assembly comprising an upper surface having a first groove and a second groove; and
   a first lens array and a second lens array arranged in a top-down direction on a side surface of the second groove,
   wherein
      a bottom surface of the first groove comprises a reflecting surface,
      a lower surface of the lens assembly comprises a third groove and a fourth groove, and a depth of the fourth groove is different from a depth of the third groove,
      the optical module further comprises a third lens array and a fourth lens array, a portion of lenses in the third lens array and the fourth lens array are positioned on a bottom surface of the fourth groove, and a remaining portion of the lenses in the third lens array and the fourth lens array are positioned on a bottom surface of the third groove,
      the first photoelectric chip is configured such that light coming from or to the first photoelectric chip passes through the third lens array, is reflected by the reflecting surface and passes through the first lens array, and
      the second photoelectric chip is configured such that light coming from or to the second photoelectric chip passes through the fourth lens array, is reflected by the reflecting surface and passes through the second lens array.

2. The optical module according to claim 1, further comprising an optical fiber bracket in the second groove, wherein
   the optical fiber bracket comprises optical fiber arrays along the top-down direction,
   the first lens array corresponds to a first optical fiber array of the optical fiber arrays, and
   the second lens array corresponds to a second optical fiber array of the optical fiber arrays.

3. The optical module according to claim 2, wherein both sides of the first lens array have positioning mechanisms, and the positioning mechanisms are configured to be inserted into corresponding positioning holes in the optical fiber bracket.

4. The optical module according to claim 2, wherein both sides of the second lens array have positioning mechanisms, and the positioning mechanisms are configured to be inserted into corresponding positioning holes in the optical fiber bracket.

5. The optical module according to claim 2, further comprising guiding pins, wherein
   both sides of the first lens array comprise first fixing holes,
   both ends of a side surface of the optical fiber bracket comprise second fixing holes corresponding to the first fixing holes, and
   both ends of each of the guiding pins are inserted into one of the first fixing holes and a corresponding one of the second fixing holes to fix the optical fiber bracket in the second groove.

6. The optical module according to claim 2, further comprising guiding pins, wherein
   both sides of the second lens array comprise first fixing holes,
   both ends of a side surface of the optical fiber bracket comprise second fixing holes corresponding to the first fixing holes, and both ends of each of the guiding pins are inserted into one of the first fixing holes and a corresponding one of the second fixing holes to fix the optical fiber bracket in the second groove.

7. The optical module according to claim 1, wherein
the third lens array is over the first photoelectric chip, and the fourth lens array is over the second photoelectric chip.

8. The optical module according to claim 7, wherein
the circuit board comprises a third driving chip, a third photoelectric chip, a fourth photoelectric chip and a fourth driving chip in order along a second direction parallel to the first direction,
the lens assembly houses the third photoelectric chip and the fourth photoelectric chip,
the third groove is over the third photoelectric chip and the fourth photoelectric chip, and
the fourth groove is over the first photoelectric chip and the second photoelectric chip.

9. The optical module according to claim 1, wherein an inclination angle of the reflecting surface is in a range of 40° to 50°.

10. The optical module according to claim 1, wherein
the first lens array comprises at least eight convex lenses, and
the second lens array comprises at least eight convex lenses.

11. The optical module according to claim 10, further comprising a first housing and a second housing, wherein
the circuit board, the first driving chip, the first photoelectric chip, the second photoelectric chip, the second driving chip and the lens assembly are packaged in a chamber enclosed by the first housing and the second housing.

* * * * *